US011776599B2

(12) United States Patent
Shyvers

(10) Patent No.: US 11,776,599 B2
(45) Date of Patent: Oct. 3, 2023

(54) ENCODED ENABLE CLOCK GATERS

(71) Applicant: Advanced Micro Devices, Inc., Santa Clara, CA (US)

(72) Inventor: Patrick J. Shyvers, Fort Collins, CO (US)

(73) Assignee: Advanced Micro Devices, Inc., Santa Clara, CA (US)

(*) Notice: Subject to any disclaimer, the term of this patent is extended or adjusted under 35 U.S.C. 154(b) by 0 days.

(21) Appl. No.: 17/485,178

(22) Filed: Sep. 24, 2021

(65) Prior Publication Data

US 2023/0096138 A1 Mar. 30, 2023

(51) Int. Cl.
*G11C 7/22* (2006.01)
*G11C 7/10* (2006.01)

(52) U.S. Cl.
CPC .............. *G11C 7/222* (2013.01); *G11C 7/106* (2013.01); *G11C 7/1039* (2013.01); *G11C 7/1087* (2013.01)

(58) Field of Classification Search
CPC ....... G11C 7/222; G11C 7/1039; G11C 7/106; G11C 7/1087
USPC ....................................................... 365/233.1
See application file for complete search history.

(56) References Cited

U.S. PATENT DOCUMENTS 6,204,695 B1 * 3/2001 Alfke ........................ G06F 1/10 327/141
8,000,156 B2 * 8/2011 Van Winkelhoff ....... G11C 8/12 365/230.03
9,158,328 B2 * 10/2015 Park ..................... G11C 7/1087
9,269,423 B2 2/2016 Sever
2006/0091918 A1 * 5/2006 Lin ...................... H03K 23/667 327/113
2009/0158076 A1 6/2009 Chejara
2013/0021064 A1 * 1/2013 Elvey .................... G06F 30/327 326/93
2013/0121072 A1 5/2013 Li
2014/0119146 A1 * 5/2014 Lilly ........................ G11C 7/22 365/227
2020/0249716 A1 8/2020 Mohanty et al.

FOREIGN PATENT DOCUMENTS

KR 10-2018-0041427 A 4/2018

* cited by examiner

*Primary Examiner* — Connie C Yoha
(74) *Attorney, Agent, or Firm* — Volpe Koenig

(57) ABSTRACT

A processing device is provided which includes a processor and a data storage structure. The data storage structure comprises a data storage array comprising a plurality of lines. Each line comprises at least one A latch configured to store a data bit and a clock gater. The data storage structure also comprises a write data B latch configured to store, over different clock cycles, a different data bit, each to be written to the at least one A latch of one of the plurality of lines. The data storage structure also comprises a plurality of write index B latches shared by the clock gaters of the lines. The write index B latches are configured to store, over the different clock cycles, combinations of index bits having values which index one of the lines to which a corresponding data bit is to be stored.

20 Claims, 4 Drawing Sheets

DATA STORAGE ARRAY 302
230
X1
304
304
308
X1
WrData B
306
en
clk
data
Line 0
Line 1
Line 2
Line N
X1
312
DECODER
0x0
WrData B
310
A
A
• • •
A

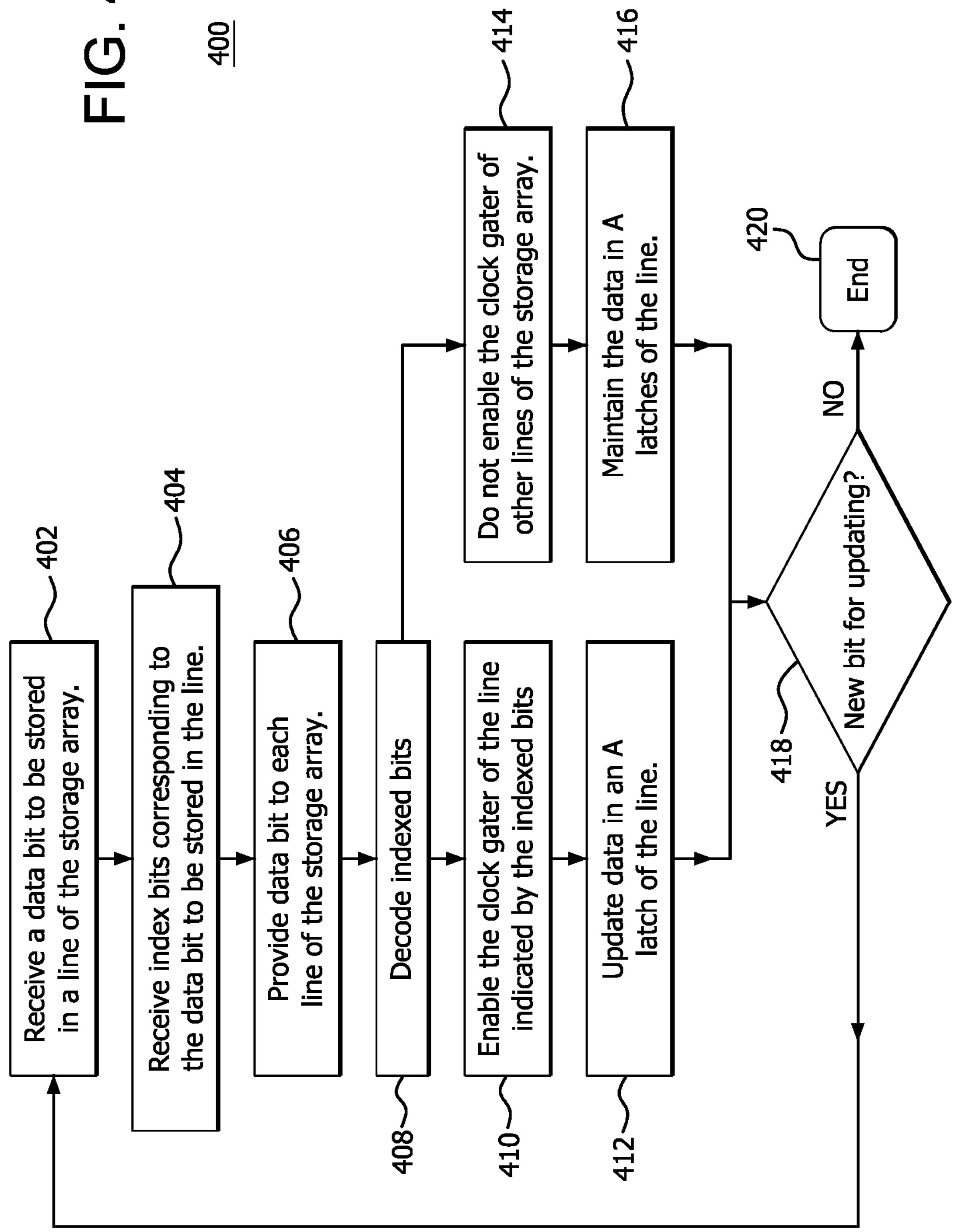
FIG. 4
400
402
Receive a data bit to be stored in a line of the storage array.
404
Receive index bits corresponding to the data bit to be stored in the line.
406
Provide data bit to each line of the storage array.
408
Decode indexed bits
410
Enable the clock gater of the line indicated by the indexed bits
412
Update data in an A latch of the line.
414
Do not enable the clock gater of other lines of the storage array.
416
Maintain the data in A latches of the line.
418
New bit for updating?
YES
NO
420
End

ENCODED ENABLE CLOCK GATERS

BACKGROUND

Data storage structures are used for variety of functions in a processing device. A data storage array is an indexed structure which includes a collection of values, each identified by an array index. For example, wider (e.g., larger number of bits per entry) data storage arrays are typically used to store and synchronize data to and from memory (e.g., main memory, cache memory). Less wide (smaller number of bits per line) data storage arrays can be used for performing other functions (e.g., scheduling, tracking, and measuring data). For example, during execution of a program, a 1-bit wide data storage array can be used to track multiple entries of a cache in which each bit indicates whether or not a specific entry is valid or invalid.

BRIEF DESCRIPTION OF THE DRAWINGS

A more detailed understanding can be had from the following description, given by way of example in conjunction with the accompanying drawings wherein:

FIG. 4 is a flow diagram illustrating an example method of accessing a data storage array according to features of the present disclosure.

DETAILED DESCRIPTION

Figure 1:
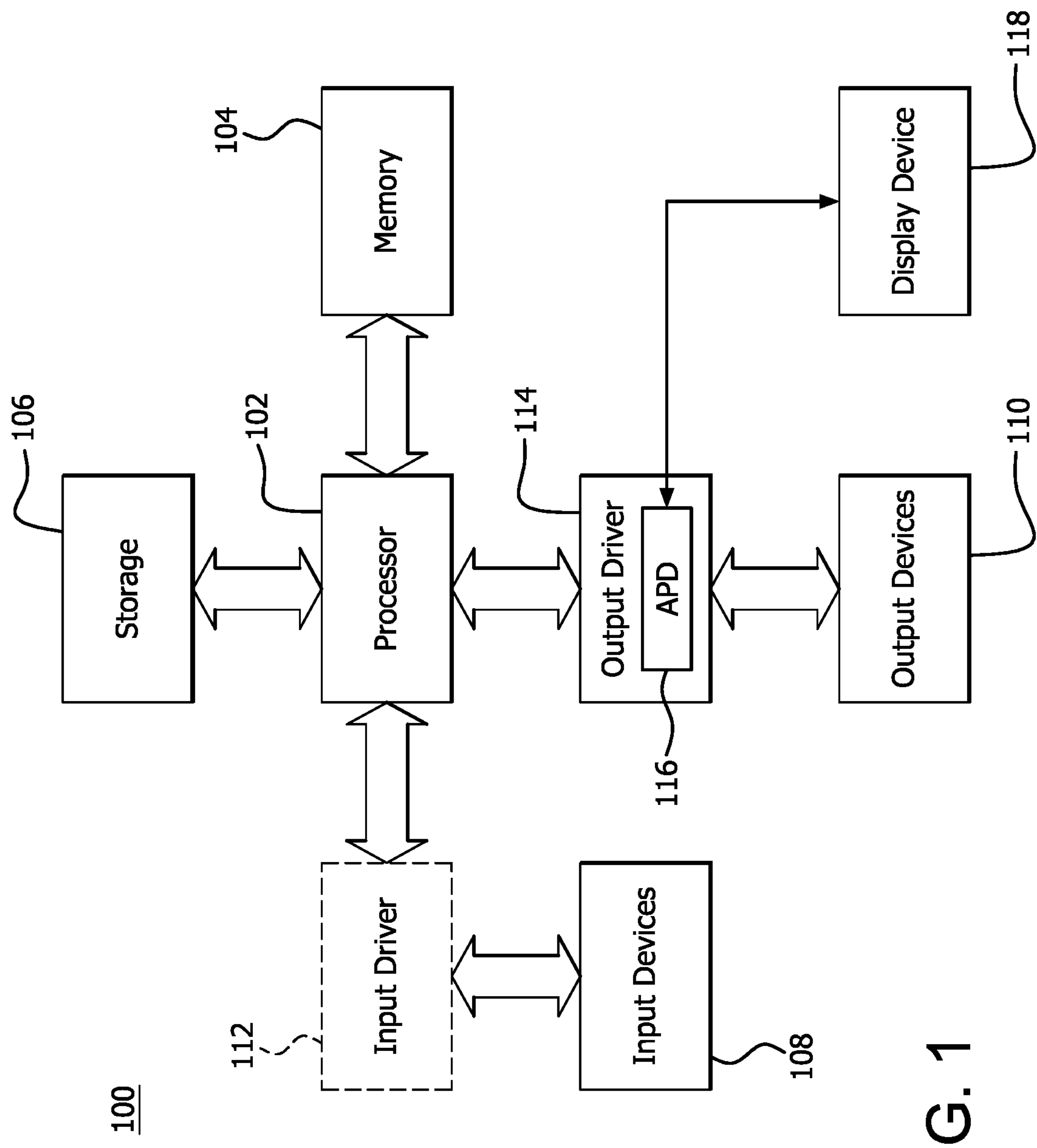
FIG. 1 is a block diagram of an example device in which one or more features of the disclosure can be implemented.

Conventional data storage arrays include an array of logic circuits, such as flip flops, with each flip flop storing a single bit of data of a line (e.g., entry). Each line of data is stored in a corresponding line of the array. The size of a data storage array (e.g., number of flip fops) varies depending on the number of lines in an array and the width of the lines in the array. Each line in the array includes a number of flip flops used to store a corresponding number of bits of data for each line of data. For example, a conventional data storage array configured to store 100 8-bit wide lines of data includes 800 flip flops. That is each line includes 8 flip flops, with each flip flop in a line storing one of the 8 bits of data of the line.

In addition to storing the lines of data, flip flops are also used to control the synchronous flow of data. At the transition of a clock cycle, a flip-flop either updates (i.e., stores a new bit of data) or retains its bit of data. For example, each flip flop in a conventional data storage array includes two latches (i.e., an A latch and a B latch). The A latch is used to store a bit of data of a line. The value input to the B latch, at the transition of a clock cycle, causes the flip-flop to either update or retain its bit of data. Each A latch and B latch occupies physical area in a device. The area occupied by the number of A latches and B latches increases as the size of the array increases.

The number of B latches in the array can be reduced, however, by using a common B latch for each line. The bits of a single line are written to, and read from, the array at the same time (e.g., at a transition of a clock cycle). Accordingly, a single B latch can be used to cause each of the A latches of a line to either change or retain their data at the transition of a clock cycle. That is, instead of using a B latch for each A latch in a line, the data in the line can be updated using a single common B latch in communication with each of the A latches of the line.

However, typically only a small number of lines of data are updated at the same time and the data in the lines of the storage array that are not being updated must be maintained while the other lines are being updated. The data in the lines are maintained by either using a multiplexor to hold the data or by using a clock gater.

While multiplexors can be used to maintain the data in the lines, clock gaters maintain the data more efficiently because clock gaters occupy less area and consume less power than multiplexors to maintain the data and implement the storage array. A clock gater is used to control whether the data in an A latch is either updated or retained at the transition of a clock cycle. A clock gater receives two input signals, namely a clock signal and an enable signal (i.e., a control signal). Depending on the value (e.g., 0 or 1) of the enable signal, the clock signal is either provided to the A latch or not provided to the A latch. For example, the clock gater continuously receives the clock signal (i.e., indicating the transitions of each clock cycle). When the value of the enable signal to the clock gater is 1, the clock signal is provided to the A latch and the A latch is updated to store a new bit of data. When the value of the enable signal to the clock gater is 0, the clock signal is not provided to the A latch and the bit of data stored in the A latch is maintained.

Conventional storage arrays include common clock gaters for each line in the array. Accordingly, a single enable signal can be used to control whether a line of data in the A latches are either updated or retained at the transition of a clock cycle. However, each clock gater also uses a B latch (i.e., each clock gater occupies the area of a B latch as described above). That is, while a number of B latches are removed from each line, an additional B latch is added to each line in the storage array for the clock gater in each line. As can be appreciated, the use of a common clock gater (i.e., a single B latch) for each line becomes more structurally efficient as the number of bits per line (i.e., 64-bit wide lines) increases because a single B latch can be used to replace a larger number of B latches, for each A latch, in a line. That is, more B latch area is reduced when a larger number of B latches (corresponding to the larger number of A latches) is replaced by a single common B latch.

However, increasing the number of bits per line (while maintaining the same overall capacity of the array) can also cause increased power consumption and latency. For example, in some cases, a portion of the bits of a line (i.e., not all the bits of a line) are updated at the same time (e.g., at the transition of a clock signal). When a portion of the bits of a line are updated, a read-modify-write operation is performed. That is, the line of data is read out, a portion of the bits of the line are changed and the line is rewritten back to the array with the changed portion of bits. Read-modify-write operations are inefficient because more power is consumed to perform the operations. In addition, because the data must be first read out before it is changed and rewritten, time is inefficiently spent by performing reads to support rewrites instead of performing reads to get useful data. As can be appreciated, read-modify-write operations become more inefficient as the number of bits per line increases. For example, when a portion (e.g., 1 bit) of a 2-bit wide line is updated, the 2 bits of the line are read out, the 1 bit is updated and 2 bits are rewritten back to the array. In comparison, when the 1 bit to be updated is a portion of a wider line (e.g., 8 bit wide line), an increased number of bits is read out of the array and rewritten to the array. That is, 8 bits are read out, the 1 bit is updated and 8 bits are rewritten back to the array.

Accordingly, increasing the number of bits per line is more structurally efficient (as described above), but is less efficient, in terms of power consumption and latency. Likewise, decreasing the number of bits per line is more efficient, in terms of power consumption and latency, but is less structurally efficient.

Features of the present disclosure include apparatuses and methods for efficiently accessing a data storage array by using a small number of common write index B latches shared between the clock gaters of each line. The common write index B latches are used to index data to be stored at a corresponding line and enable the clock signal of the corresponding line to update the data in the corresponding line without enabling the clock signal of other lines to maintain the data in the other lines.

Features of the present disclosure reduce the structurally inefficiency afforded by the number of bits per line. Features of the present disclosure can efficiently access of storage arrays having any number of bits per line (i.e., any number of A latches per line). Using a small number of common write index B latches shared between the clock gaters of each line reduces the structural inefficiency of conventional storage structures (i.e., which use a common clock gater and B latch for each line) when accessing a storage array when the number bits per line is small (e.g., 1 or 2). Also, because the number of bits per line can be reduced without being structurally inefficient, features of the present disclosure reduce the overall area (occupied by latches) and reduce the inefficiencies of performing read-modify-write operations.

A processing device is disclosed which comprises a processor and a data storage structure. The data storage structure comprises a data storage array comprising a plurality of lines. Each line comprises at least one A latch configured to store a data bit and a clock gater. The data storage structure also comprises a write data B latch configured to store, over different clock cycles, a different data bit, each to be written to the at least one A latch of one of the plurality of lines. The data storage structure also comprises a plurality of write index B latches shared by the clock gaters of the plurality of lines. The plurality of write index B latches are configured to store, over the different clock cycles, combinations of index bits, having values which index one of the lines to which a corresponding data bit is to be stored A data storage structure for use with a processing device is disclosed which comprises a data storage array comprising a plurality of lines, each line comprising at least one A latch configured to store a data bit and a clock gater. The data storage structure also comprises a write data B latch configured to store, over different clock cycles, a different data bit, each to be written to the at least one A latch of one of the plurality of lines. The data storage structure also comprises a plurality of write index B latches shared by the clock gaters of the plurality of lines and configured to store, over the different clock cycles, combinations of index bits, having values which index one of the lines to which a corresponding data bit is to be stored.

A method of accessing a data storage array is disclosed which comprises providing a data bit, from a write data B latch, to each of a plurality of lines of a storage array. Each line comprises at least one A latch and a clock gater. The method also comprises enabling the clock gater of one of the lines that is indexed by a combination of indexed bits in write index B latches shared by the clock gaters of the lines, updating the at least one A latch of the one line, indexed by the values of the combination of index bits, with the data bit, and maintaining previously stored data in at least one A latches of the other lines not indexed by the combination of index bits.

FIG. 1 is a block diagram of an example device 100 in which one or more features of the disclosure can be implemented. The device 100 can include, for example, a computer, a gaming device, a handheld device, a set-top box, a television, a mobile phone, or a tablet computer. The device 100 includes a processor 102, a memory 104, a storage 106, one or more input devices 108, and one or more output devices 110. The device 100 can also optionally include an input driver 112 and an output driver 114. It is understood that the device 100 can include additional components not shown in FIG. 1.

In various alternatives, the processor 102 includes a central processing unit (CPU), a graphics processing unit (GPU), a CPU and GPU located on the same die, or one or more processor cores, wherein each processor core can be a CPU or a GPU. In various alternatives, the memory 104 is be located on the same die as the processor 102, or is located separately from the processor 102. The memory 104 includes a volatile or non-volatile memory, for example, random access memory (RAM), dynamic RAM (DRAM), or a cache.

The storage 106 includes a fixed or removable storage, for example, a hard disk drive, a solid state drive, an optical disk, or a flash drive. The input devices 108 include, without limitation, a keyboard, a keypad, a touch screen, a touch pad, a detector, a microphone, an accelerometer, a gyroscope, a biometric scanner, or a network connection (e.g., a wireless local area network card for transmission and/or reception of wireless IEEE 802 signals). The output devices 110 include, without limitation, a display, a speaker, a printer, a haptic feedback device, one or more lights, an antenna, or a network connection (e.g., a wireless local area network card for transmission and/or reception of wireless IEEE 802 signals).

The input driver 112 communicates with the processor 102 and the input devices 108, and permits the processor 102 to receive input from the input devices 108. The output driver 114 communicates with the processor 102 and the output devices 110, and permits the processor 102 to send output to the output devices 110. It is noted that the input driver 112 and the output driver 114 are optional components, and that the device 100 will operate in the same manner if the input driver 112 and the output driver 114 are not present. The output driver 114 includes an accelerated processing device ("APD") 116 which is coupled to a display device 118. The APD is configured to accept compute commands and graphics rendering commands from processor 102, to process those compute and graphics rendering commands, and to provide pixel output to display device 118 for display. As described in further detail below, the APD 116 includes one or more parallel processing units configured to perform computations in accordance with a single-instruction-multiple-data ("SIMD") paradigm. Thus, although various functionality is described herein as being performed by or in conjunction with the APD 116, in various alternatives, the functionality described as being performed by the APD 116 is additionally or alternatively performed by other computing devices having similar capabilities that are not driven by a host processor (e.g., processor 102) and configured to provide graphical output to a display device 118. For example, it is contemplated that any processing system that performs processing tasks in accordance with a SIMD paradigm may be configured to perform the functionality described herein. Alternatively, it is contemplated that computing systems that do not perform processing tasks in accordance with a SIMD paradigm performs the functionality described herein.

Figure 2:
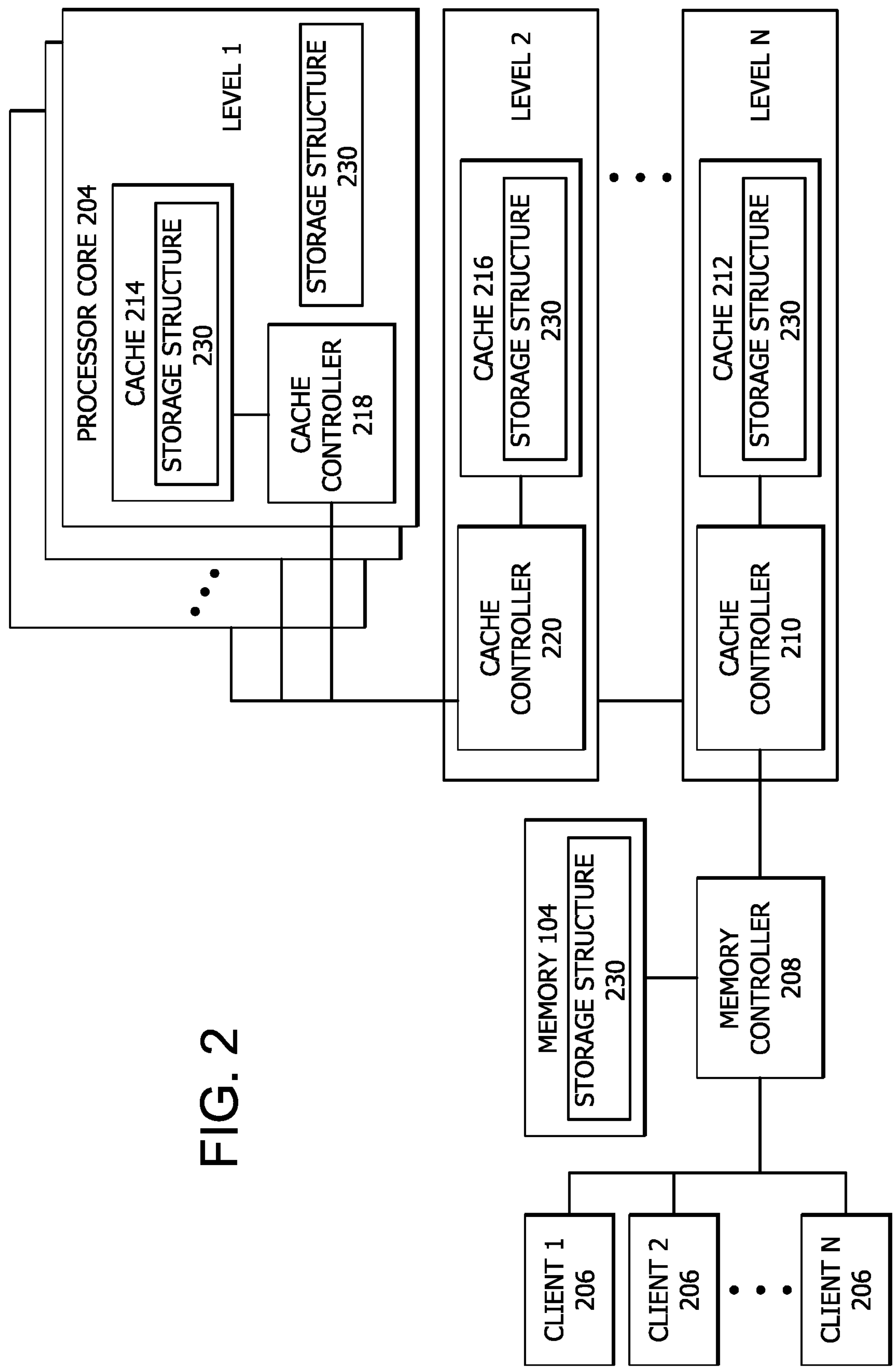
FIG. 2 is a block diagram illustrating different components of a processing device in which a storage structure according to the present disclosure can be provided.

FIG. 2 is a block diagram illustrating different components of a processing device in which a storage structure 230 can be provided according to the present disclosure. Some components shown in FIG. 2 are, for example, components of a processor, such as an accelerated processor (e.g., GPU). Features of the disclosure can be executed by one or more processors of a first type, such as a CPU, and/or one or more processors of a second type, such as a GPU.

Features of the disclosure can be implemented using caches on any of a plurality of levels. For example, as shown in FIG. 2, components include a plurality of processor cores 204. Each core 204 includes a corresponding level 1 cache controller 218 in communication with a corresponding level 1 cache 214 and configured to process data using the corresponding level 1 cache 214.

As further shown in FIG. 2, components also includes a level 2 cache controller 220/processor in communication with level 2 cache 216 and configured to process data using level 2 cache 216. Cache controller/processor 220 is also in communication with a next cache level (higher cache level). Any number of N level caches can be used. The next level cache, such as N level cache 212 (e.g., last level cache) and N level cache controller 210 can be in communication with and shared by caches of multiple processors, such as for example, caches of a CPU or GPU (not shown), which may be located on the same die, or multiple dies.

Memory controller/processor 208 is in communication with memory 104 (e.g., DRAM) and cache controllers 220 and 218. As shown in FIG. 2, multiple clients 206 are in communication with memory controller 208. When a client 206 requests a portion of memory to be allocated, memory controller 208 is configured to receive and service requests, from client 206 (e.g., display client) and access cache 216 via cache controller 220 and cache 214 via cache controller 218. Memory controller/processor 208 is configured to receive requests from clients 206, allocate memory, control access to one or more caches (e.g., last level cache 212) and various other functions described herein. For example, memory controller/processor 208 is configured to control cache access by one or more clients 206. For simplified explanation purposes, FIG. 2 shows a single client 206. Memory controller is configured, however, to receive requests from any number of clients.

Data storage structures can be implemented in a variety of different components of a processing device. For example, as shown in FIG. 2, data storage structures 240 can be implemented in a processor core 204, as part of memory 104 or a cache such as an L1 cache, an L2 cache or any level cache. Data storage structures can be used to perform a variety of functions. Such as storing data and synchronizing data flow to and from memory, scheduling, tracking, and measuring data. For example, during execution of a program, a 1-bit wide data storage array can be used to track multiple entries of a cache in which each bit indicates whether or not a specific entry is valid or invalid. Data storage structures can also be used at various locations of a device to perform any functions in which random access to the indexed storage structure is implemented.

Figure 3:
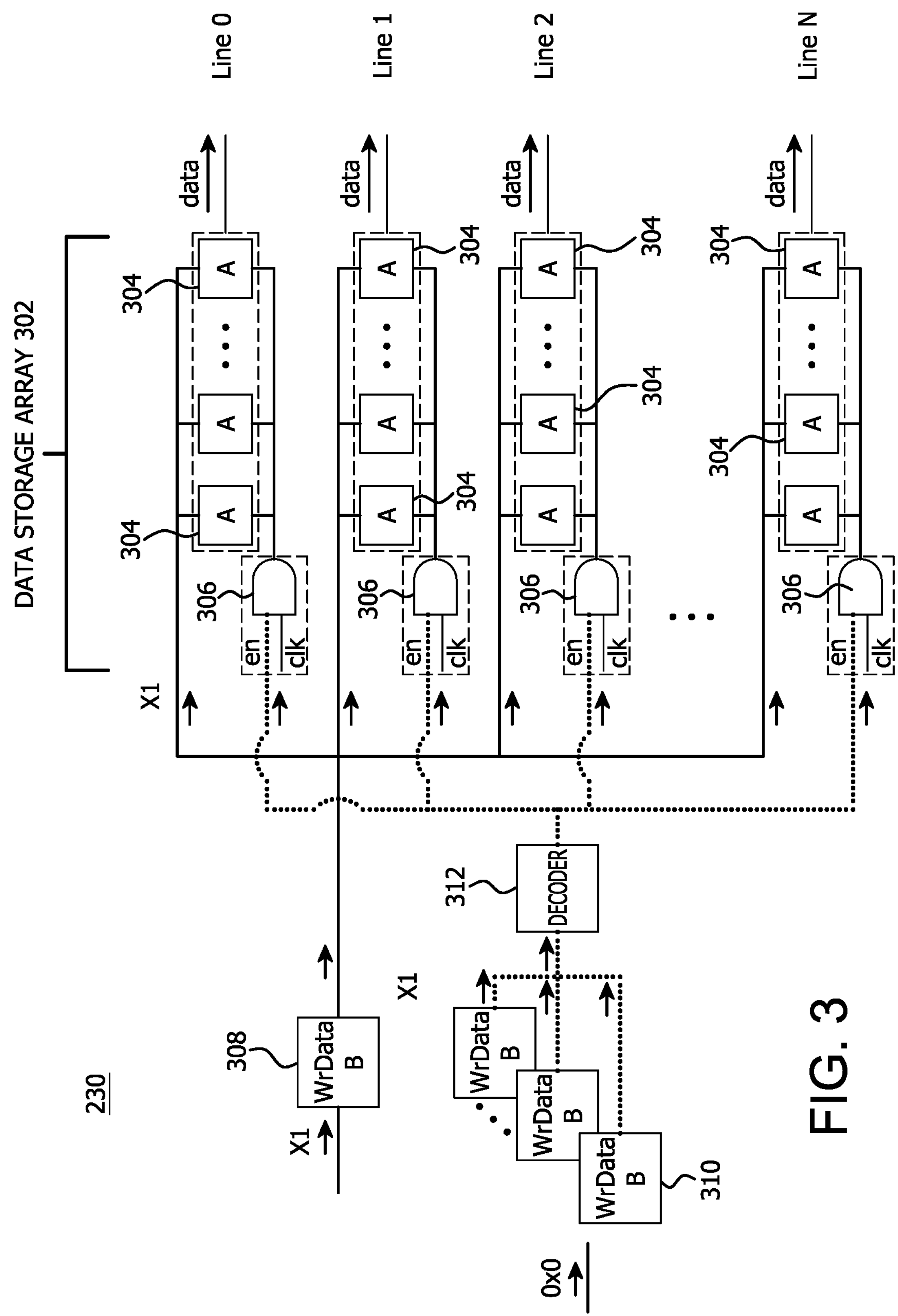
FIG. 3 is an illustration of accessing an example storage array of a data storage structure according to features of the present disclosure.

FIG. 3 is an illustration of accessing an example storage array 302 of a data storage structure 230 according to features of the present disclosure. As shown in FIG. 3, data storage array 302 includes a plurality of lines (i.e., Line 0 to Line N). Features of the present disclosure can be implemented for a data storage array 302 having any number of lines. Each line includes a plurality of A latches 304. The number of A latches 304 in each line depends on the width of the line (i.e., the number of bits which can be stored in each line. Features of the present disclosure can be implemented for a storage array having any number of A latches, including a single A latch. Each A latch 304 is configured to hold 1 bit of data in the line.

Each line of the storage array 302 also includes a single clock gater 306. Each clock gater 306 includes 2 inputs (i.e., a clock input and an enable input) and an output which is in communication (e.g., electrically connected) with each of the A latches 304 of the line. Each clock gater 306 continuously receives the clock signal (i.e., indicating the transitions of each clock cycle). When the value of the enable signal to the clock gater 306 is 1, the clock signal is provided to the A latches of the line and the A latches are updated to store a new bit of data. When the value of the enable signal to the clock gater 306 is 0, the clock signal is not provided to the A latches 304 and the bits of data stored in the A latches are maintained.

Storage structure 230 also includes a write data (WrData) B latch 308. The write data B latch 308 is in communication (e.g., electrically connected) with each of the A latches 304 in the storage array 302. The write data B latch 308 is configured to store a different data bit over different clock cycles. Each data bit in the write data B latch 308 is written to one of the A latches 304 in one of the lines.

Storage structure 230 also includes a plurality of write index (WrIndx) B latches 310, each configured to store an index bit. The write index B latches 310 are shared by, and in communication with, each of the clock gaters 306 in each line of the storage array 302. The write index B latches 310 together store different combinations of index bits, over the different clock cycles. The values of each combination of index bits are used (e.g., by a processor) to index the line of the data storage array 302 to which a corresponding data bit, concurrently stored in the write data B latch 308, is to be stored.

The number of write index B latches 310 depends on the number of lines in the storage array 302. That is, the number of write index B latches in the storage structure 230 corresponds to a number of index bits used to index each of the lines in the storage array 302. For example, if the storage array 302 includes 4 lines, then 2 write index B latches 310 are used to store a combination of 2 index bits to index one of the 4 lines (e.g., 00 indexes the bit to line 0, 01 indexes the bit to line 1, 10 indexes the bit to line 2 and 11 indexes the bit to line 3) to which a corresponding data bit, in the write data B latch, is to be stored 308. If the storage array 302 includes 8 lines, then 3 write index B latches 310 are used to store a combination of 3 index bits to index one of the 8 lines (e.g., 000 indexes the data bit to line 0, 001 indexes the data bit to line 1, and so on).

The bits of data in the write index B latches 310 are decoded by decoder 312. The decoded bits indicate a line to which a bit of data in the write data B latch 308 is to be stored. An enable signal (e.g., a value of "1") is provided to a clock gater 306 of the corresponding line to which the bit of data is to be stored. The decoder 312 is, for example, implemented in hardware. The decoder 312 can also be implemented using a combination of hardware and software (e.g., software used to modify the behavior of the hardware decoder, such as the inclusion of decoder control bits).

Accordingly, at the transition of the clock cycle, the clock gater 306 provides the clock signal to the A latches 304 of the indexed line and the A latches 304 are updated to store a new bit of data, such that at the transition of the next clock cycle, the updated bits in the A latches 304 of the line are read out from the line 304. When the decoded bits do not indicate a line in which a data bit in the write data B latch 308 is to be stored, a non-enable signal (e.g., a value of "0") is provided to a clock gater 306 of the corresponding line and the clock signal is not enabled for the line. Accordingly, the clock signal is not provided to the A latches 304 of the line and the data bits stored in the A latches 304 are maintained (i.e., at the transition of the clock cycle the unchanged bits in the A latches 304 of the line are output by the A latches 304).

FIG. 4 is a flow diagram illustrating an example method 400 of accessing a data storage array according to features of the present disclosure. The method 400 is described along with the example storage structure 230 shown in FIG. 3. For simplified explanation purposes, in the example method 400 described below, each line is 1-bit wide (i.e., includes a single A latch 304) and the storage structure 230 includes 3 write index B latches 310 used to index the data to one of 8 lines of data in the storage array 302.

As shown at blocks 402 and 404, the method 400 includes receiving a data bit (denoted as X1 in FIG. 3) to be stored in one of the lines of a storage array 302 and receiving index bits (denoted as 0x0 in FIG. 3) corresponding to the data bit X1 to be stored in the line. The processes shown in blocks 402 and 404 can be performed sequentially in the order shown in FIG. 4. Alternatively, blocks 402 and 404 can be performed sequentially in the reverse order or can be performed concurrently.

For example, the processor provides instructions to update data in one or more lines of the data storage array 302. When an instruction is issued to update the data in the first line (i.e., line 0) of the storage array 302, the data bit X1 (e.g., having a value of "1") is provided to the write data B latch 308 and three index bits 0x0 (each bit having a value of "0") are provided to the three write index B latches 310, with each write data B latch 308 storing one of the index bits 0x0 such that the combination of index bits has a value of "000" which indexes line 0.

As shown at block 406, the method 400 includes providing the data bit X1 to each line of the storage array 230. That is, the data bit (having a value of "1") is propagated to the A latch 304 of each line in the storage array 302.

As shown at block 408, the indexed bits are decoded. Then, the clock gater 306 of the line indicated by the indexed bits is enabled, at block 410, That is, the clock gater 306 of line 0 is enabled. Accordingly, the clock signal is provided to the A latch 304 in line 0 and the A latch 304 of line 0 is updated with the data bit X1 having the value of "1," as shown at block 412, and the updated value of "1" is read out from line 0.

The clock gaters 306 in each of the other lines (i.e., lines 2-8) of the data storage array are not enabled, as shown at block 414, because lines 2-8 are not indicated by the index bits 0x0 that correspond to the data bit X1 having the value of "1." Accordingly, the clock signal is not provided to the A latch 304 in lines 2-8 and the A latches 304 of lines 2-8 are maintained. As shown at block 416, the unchanged data bits in the A latches of lines 2-8 are read out.

As shown at block 418, if a new bit is provided for updating the data of one of the lines of the storage array 304, the method proceeds back to block 402. For example, if the same instruction or different instruction is issued to update the data in the last line (i.e., line 8) of the storage array 302 with a data bit (having a value of "0"), the data bit is provided to the write data B latch 308 and the combination of index bits having a value of "111" are provided to the three write index B latches 310, with each write data B latch 308 storing one of the three index bits. The bits are again decoded and the clock gater 306 of line 8 is enabled. The clock signal is provided to the A latch 304 in line 8 and the A latch 304 of line 8 is updated with the data bit having the value of "0." The clock gaters 306 in each of the other lines (i.e., lines 1-7) are not enabled, the clock signal is not provided to the A latches 304 in lines 1-7 and the data bits in the A latches 304 of lines 1-7 are maintained.

If a new bit is not provided for updating the data of one of the lines of the storage array 304, the method ends at block 420.

Accordingly, while features of the present disclosure can be implemented with any number of bits per line (i.e., any number of A latches per line), features of the present disclosure can efficiently access the storage array 302 even when the number bits per line is small (e.g., 1 or 2). That is, the example storage array 302 reduces the structural inefficiency of conventional storage structures, which use a common clock gater and B latch for each line, accessing a data storage array with a small number of bits per line for each line. In addition, features of the present disclosure reduce the power consumption and latency It should be understood that many variations are possible based on the disclosure herein. Although features and elements are described above in particular combinations, each feature or element can be used alone without the other features and elements or in various combinations with or without other features and elements.

The various functional units illustrated in the figures and/or described herein (including, but not limited to, the processor 102, the input driver 112, the input devices 108, the output driver 114, the output devices 110, the accelerated processing device 116, memory controller/processor 208, and the cache controller/processors 210, 218 and 220, and storage structures 230 may be implemented as a general purpose computer, a processor, or a processor core, or as a program, software, or firmware, stored in a non-transitory computer readable medium or in another medium, executable by a general purpose computer, a processor, or a processor core. The methods provided can be implemented in a general purpose computer, a processor, or a processor core. Suitable processors include, by way of example, a general purpose processor, a special purpose processor, a conventional processor, a digital signal processor (DSP), a plurality of microprocessors, one or more microprocessors in association with a DSP core, a controller, a microcontroller, Application Specific Integrated Circuits (ASICs), Field Programmable Gate Arrays (FPGAs) circuits, any other type of integrated circuit (IC), and/or a state machine. Such processors can be manufactured by configuring a manufacturing process using the results of processed hardware description language (HDL) instructions and other intermediary data including netlists (such instructions capable of being stored on a computer readable media). The results of such processing can be maskworks that are then used in a semiconductor manufacturing process to manufacture a processor which implements features of the disclosure.

The methods or flow charts provided herein can be implemented in a computer program, software, or firmware incorporated in a non-transitory computer-readable storage medium for execution by a general purpose computer or a processor. Examples of non-transitory computer-readable storage mediums include a read only memory (ROM), a random access memory (RAM), a register, cache memory, semiconductor memory devices, magnetic media such as internal hard disks and removable disks, magneto-optical media, and optical media such as CD-ROM disks, and digital versatile disks (DVDs).

What is claimed is:

1. A processing device comprising:

a processor; and a data storage structure comprising:

a data storage array comprising a plurality of lines, each line comprising at least one A latch configured to store a data bit and a clock gater;

a write data B latch configured to store, over different clock cycles, a different data bit, each to be written to the at least one A latch of one of the plurality of lines; and a plurality of write index B latches shared by the clock gaters of the plurality of lines and configured to store, over the different clock cycles, combinations of index bits having values which index one of the lines to which a corresponding data bit is to be stored.

2. The processing device of claim 1, wherein a number of write index B latches in the data storage structure corresponds to a number of index bits used to index each of the lines in the data storage array.

3. The processing device of claim 1, wherein:

the corresponding data bit is provided to each of the lines;

the at least one first latch of the one line, indexed by the values of the combinations of index bits, is updated with the corresponding data bit; and previously stored data in first latches of other lines, not indexed by the combinations of index bits, are maintained.

4. The processing device of claim 3, wherein:

the clock gater of the one line indexed by the combinations of index bits is enabled; and the clock gaters in each of the other lines are not enabled.

5. The processing device of claim 4, wherein:

the updated corresponding data bit in the at least one first latch of the one line is read out from the one line; and the previously stored data that is maintained in the first latches of the other lines are read out from the other lines.

6. The processing device of claim 4, further comprising a decoder configured to decode the combinations of index bits, wherein the clock gater of the one line indexed by the decoded combinations of index bits, is enabled.

7. The processing device of claim 6, wherein the processor is configured to:

provide an instruction to update the one line with the corresponding data bit, and control the decoder to decode the combinations of indexed bits indexing the one line.

8. The processing device of claim 1, wherein the lines of the data storage array are 1-bit wide and each line comprises a single first latch configured to store the data bit.

9. A data storage structure for use with a processing device, the data storage structure comprising:

a data storage array comprising a plurality of lines, each line comprising at least one first latch, configured to store a data bit, and a clock gater;

a write data second latch configured to store, over different clock cycles, a different data bit, each to be written to the at least one first latch of one of the plurality of lines; and a plurality of write index second latches shared by the clock gaters of the plurality of lines and configured to store, over the different clock cycles, combinations of index bits, having values which index one of the lines to which a corresponding data bit is to be stored.

10. The data storage structure of claim 8, wherein a number of write index second latches in the data storage structure corresponds to a number of index bits used to index each of the lines in the data storage array.

11. The data storage structure of claim 9, wherein:

the corresponding data bit is provided to each of the lines;

the at least one first latch of the one line, indexed by the values of the combinations of index bits, is updated with the corresponding data bit; and previously stored data in first latches of other lines, not indexed by the combinations of index bits, are maintained.

12. The data storage structure of claim 11, wherein:

the clock gater of the one line indexed by the combinations of index bits is enabled; and the clock gaters in each of the other lines are not enabled.

13. The data storage structure of claim 12, wherein:

the updated corresponding data bit in the at least one first latch of the one line is read out from the one line; and the previously stored data that is maintained in the first latches of the other lines are read out from the other lines.

14. The data storage structure of claim 12, further comprising a decoder configured to decode the combinations of index bits, wherein the clock gater of the one line indexed by the decoded combinations of index bits, is enabled.

15. The data storage structure of claim 9, wherein the storage array is a 1-bit wide line array and each line comprises a single first latch configured to store the data bit.

16. A method of accessing a data storage array comprising:

providing a data bit, from a write data second latch, to each of a plurality of lines of a storage array, each line comprising at least one first latch and a clock gater;

enabling the clock gater of one of the plurality of lines that is indexed by a combination of index bits in write index second latches shared by the clock gaters of the lines;

updating the at least one first latch of the one line, indexed by values of the combination of index bits, with the data bit; and maintaining previously stored data in at least one first latches of the other lines not indexed by the combination of index bits.

17. The method of claim 16, further comprising:

reading out the data bit that is updated in the at least one first latch of the one line, and reading out the data that is maintained in the at least one first latches of the other lines.

18. The method of claim 16, further comprising:

decoding the combination of index bits; and enabling the clock gater of the one line indexed by the decoded combination of index bits.

19. The method of claim 18, further comprising:

providing an instruction to update the one line with the data bit; and controlling the decoding of the combination of index bits indexing the one line.

20. The method of claim 16, wherein a number of write index second latches corresponds to a number of index bits used to index each of the lines in the storage array.

* * * * *